United States Patent
Gurumurthy et al.

(10) Patent No.: US 7,888,784 B2
(45) Date of Patent: Feb. 15, 2011

(54) SUBSTRATE PACKAGE WITH THROUGH HOLES FOR HIGH SPEED I/O FLEX CABLE

(75) Inventors: Charan Gurumurthy, Gilbert, AZ (US); Sanka Ganesan, Chandler, AZ (US); Chandrashekhar Ramaswamy, Chandler, AZ (US); Mark Hlad, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 87 days.

(21) Appl. No.: 12/242,528

(22) Filed: Sep. 30, 2008

(65) Prior Publication Data

US 2010/0078826 A1    Apr. 1, 2010

(51) Int. Cl.
*H01L 23/48* (2006.01)

(52) U.S. Cl. .............. 257/685; 257/693; 257/698; 257/724; 257/E25.023; 257/E25.026; 257/E23.011; 257/E23.078

(58) Field of Classification Search .......... 257/700, 257/784, 779–781, 712, 717–719, E23.141, 257/758, 750, 737, 738, 734, 698, 685, 693, 257/724, E25.23, E25.026, E23.011, E23.078
See application file for complete search history.

(56) References Cited

U.S. PATENT DOCUMENTS

| | | | |
|---|---|---|---|
| 6,809,268 B2 * | 10/2004 | Hayashi et al. ............. 174/260 |
| 6,809,608 B2 | 10/2004 | Fjelstad | |
| 6,884,120 B1 | 4/2005 | Haba et al. | |
| 7,014,472 B2 | 3/2006 | Fjelstad et al. | |
| 7,111,108 B2 | 9/2006 | Grundy et al. | |
| 7,148,428 B2 | 12/2006 | Meier et al. | |
| 7,227,759 B2 | 6/2007 | Grundy et al. | |
| 7,249,955 B2 | 7/2007 | Horine et al. | |
| 7,278,855 B2 | 10/2007 | Yasumura et al. | |
| 7,280,372 B2 | 10/2007 | Grundy et al. | |
| 7,307,293 B2 | 12/2007 | Fjelstad et al. | |
| 7,371,966 B2 | 5/2008 | Meier et al. | |
| 7,402,048 B2 | 7/2008 | Meier et al. | |
| 7,649,748 B2 * | 1/2010 | Kariya et al. ............... 361/782 |
| 2007/0138619 A1 * | 6/2007 | Shinagawa et al. .......... 257/700 |

OTHER PUBLICATIONS

Marshall, Donald E. et al.,"VAX 9000 packaging-the multi chip unit", Thirty-Fifth IEEE Computer Society International Conference, Compcon Spring '90, Intellectual Leverage, Digest of Papers, Feb. 26-Mar. 2, 1990, pp. 54-57.

(Continued)

*Primary Examiner*—Evan Pert
(74) *Attorney, Agent, or Firm*—Blakely, Sokoloff, Taylor & Zafman LLP (57) ABSTRACT

An assembly of substrate packages interconnected with flex cables and a method of fabrication of the substrate package. The assembly allows input/output (I/O) signals to be speedily transmitted between substrate packages via flex cable and without being routed through the motherboard. Embodiments relate to a substrate package providing separable inter-package flex cable connection. Hermetically-sealed guiding through holes are provided on the substrate package as a mechanical alignment feature to guide connection between flex cables and high speed I/O contact pads on the substrate package. Embodiments of the method of fabrication relate to simultaneously forming hermetically-sealed guiding through holes and I/O contact pads.

15 Claims, 6 Drawing Sheets

OTHER PUBLICATIONS

Kollipara, Ravi et al., "Evaluation of high density liquid crystal polymer based flex interconnect for supporting greater than 1 TB/s of memory bandwidth", Electronic Components and Technology Conference, 2008, 58th Volume, May 27-30, 2008, pp. 1132-1138.

Grundy, Kevin et al., "Designing Scalable 10G Backplane Interconnect Systems Utilizing Advanced Verification Methodologies", DesignCon 2006, 20 pages.

Fjelstad, Joseph et al., "3-Dimensional Partitioning of Printed Circuit Design for High Speed Interconnections", Presented in the ECWC 10th Conference, 2005, pp. S01-1-1-S01-1-7.

Fjelstad, Joseph et al., "3D PCB architecture for next generation high speed interconnections", Circuit World, 2005, vol. 31, Issue 4, Emerald Group Publishing Limited, pp. 25-33.

Kollipara, Ravi et al., "Evaluation of High Density LCP Based Flex Interconnect for Supporting >1 TB/s of Memory BW", 58th Electronic Components and Technology Conference, May 27-May 30, 2008, pp. 1-25.

Braunisch, Henning et al., "High-Speed Flex Chip-to-Chip Interconnect", IEEE Electrical Performance of Electronic Packaging 2006, pp. 273-276.

Braunisch, Henning et al., "Flex-Circuit Chip-to-Chip Interconnects", Electronic Components and Technology Conference 2006, pp. 1853-1859.

Braunisch, Henning et al., "High-Speed Flex-Circuit Chip-to-Chip Interconnects", IEEE Transactions on Advanced Packaging, vol. 31, Issue 1, Feb. 2008, pp. 82-90.

* cited by examiner

SUBSTRATE PACKAGE WITH THROUGH HOLES FOR HIGH SPEED I/O FLEX CABLE

BACKGROUND OF INVENTION

1. Field

The present invention relates to electronic substrate package technology, in particular a substrate package with through holes for high speed input/output (I/O) flex cables.

2. Discussion of Related Art

Traditionally, signals from a substrate package travel to another substrate package attached to a common motherboard via the sockets and motherboard. Signals traveling on this conventional path are susceptible to signal degradation and losses due to on-die parasitics, return loss and cross talks. Flex cable interconnection provides improved signal transmission quality and transfer rate.

Figure 1A:
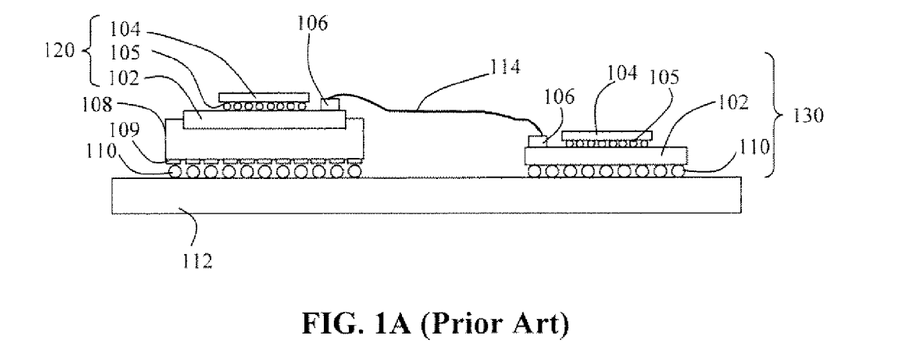
FIG. 1A and FIG. 1B illustrate side views of known flex cable connection between substrate packages.

FIG. 1A illustrates a cross sectional view of a known inter-package flex cable connection. Substrate package 120 includes die 104 attached to substrate body 102 via die bumps 105. Substrate package 120 is mounted on socket 108. Socket 108 has socket contacts 109 soldered to solder balls 110. Solder balls 110 are reflowed to form connection with motherboard 112. Substrate package 120 is interconnected with another substrate package 130 attached to motherboard 112 by way of flex cable 114. Flex cable 114 is attached to substrate packages 120, 130 by way of connector 106. Connector 106 is soldered permanently on substrate body 102 and forms part of substrate body 102. Signals between substrate packages 120, 130 are transmitted via flex cable 114 without having to route through socket 108 or motherboard 112.

Figure 1B:
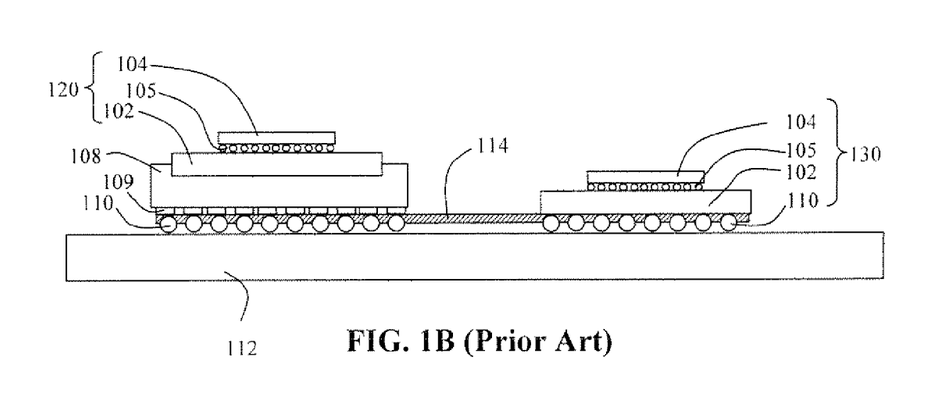

FIG. 1B illustrates another known inter-package flex cable connection. In relation to substrate package 120, flex cable 114 is inserted between socket 108 and motherboard 112. One end of flex cable 114 is soldered to socket contacts 109 while the other end of flex cable 114 is soldered to the lands side of substrate package 130. This configuration is susceptible to signal degradation as signals from die 104 pass through plated through-holes (PTH) of substrate body 102.

Inter-package flex cable connections illustrated in FIGS. 1A and 1B involve some form of permanent attachment between component parts in the configuration. The configuration in FIG. 1A involves soldering between connector 106 and at the bottom surface of substrate package 120. The configuration in FIG. 1B involves soldering of flex cable 114 to socket 108. The known configurations do not provide complete separability of the component parts involved in the inter-package flex cable connection. Complete separability between the component parts is desirable to provide flexibility in the manufacturing and assembly of the component parts.

DETAILED DESCRIPTION OF ILLUSTRATED EMBODIMENTS

Embodiments of the present invention relate to a substrate package providing separable inter-package flex cable connection and a method of fabrication of the substrate package. Input/output (I/O) signals may be speedily transmitted from a die to I/O contact pads formed on the substrate package and subsequently to another substrate package via flex cables. Embodiments of the substrate package further provide hermetically-sealed guiding through holes on the substrate package as an alignment feature to guide connection between flex cables and I/O contact pads on the substrate package. Embodiments of the method of fabrication of the substrate package relate to simultaneously forming hermetically-sealed guiding through holes and I/O contact pads.

Reference throughout the specification to "one embodiment" or "an embodiment" means that a particular feature, structure, characteristic or step described in connection with the embodiment is included in at least one embodiment of the present invention. Thus, the appearance of said phrases in various places throughout the specification does not necessarily all refer to the same embodiment unless otherwise expressed. Furthermore, the particular features, structures, characteristics or steps recited in the specification may be combined in any suitable manner in one or more embodiments. Accordingly, all such variations and modifications are included within the intended scope of the embodiments of the present invention as defined by the following claims.

Figure 2:
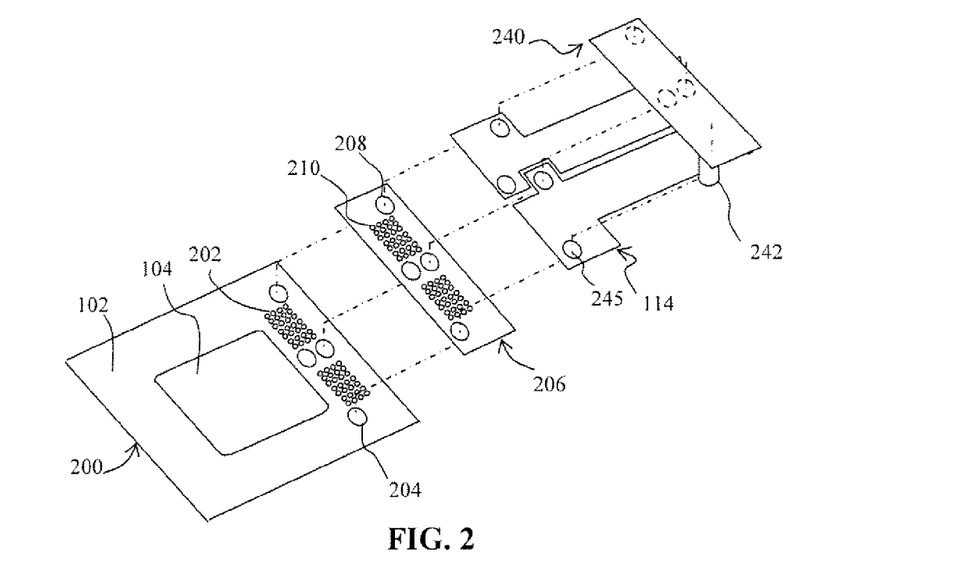
FIG. 2 illustrates an exploded view of an embodiment of the invention.

FIG. 2 illustrates an exploded view of an embodiment of the invention. The exploded view illustrates various parts which may be assembled to provide separable inter-package connection between substrate packages 200. Details of each part will be presented in the following paragraphs. Semiconductor die 104 is attached to substrate body 102 of substrate package 200. A plurality of high speed input/output (I/O) contact pads 202 are provided on substrate body 102 as terminals to speedily transmit signals to other substrate packages 200 as well as to receive signals from other substrate packages 200. In an embodiment, I/O contact pads 202 are formed on the die side surface of substrate body 102 as illustrated in FIG. 2. In another embodiment, I/O contact pads 202 may be formed on the lands side surface of substrate body 102. A plurality of substrate guiding through holes 204 are formed on substrate body 102 as a mechanical alignment feature to guide assembly of other parts with substrate package 200.

Still referring to FIG. 2, an embodiment of the invention may include one or more flex cables 114 to provide electrical connection between substrate packages 200. In an embodiment, each end of flex cables 114 may include one or more cable guiding through holes 245. Cable guiding through holes 245 are configured to align flex cables 114 against substrate guiding through holes 204.

In an embodiment, flex connector 206 may be provided as an interface between substrate package 200 and flex cables 114. An embodiment of flex connector 206 may include a plurality of connector guiding through holes 208 and a plurality of connector contacts 210. Connector guiding through holes 208 are aligned against substrate guiding through holes 204 and cable guiding through holes 245. Connector contacts 210 are configured to form electrical connection with I/O contact pads 202. In an embodiment, guiding plate 240 may be further provided to maintain alignment of flex cables 114 and flex connector 206 with substrate package 200. An embodiment of guiding plate 240 may include a plurality of guiding pins 242 capable of penetrating cable guiding through holes 245, connector guiding through holes 208 and substrate guiding through holes 204.

Figure 3A:
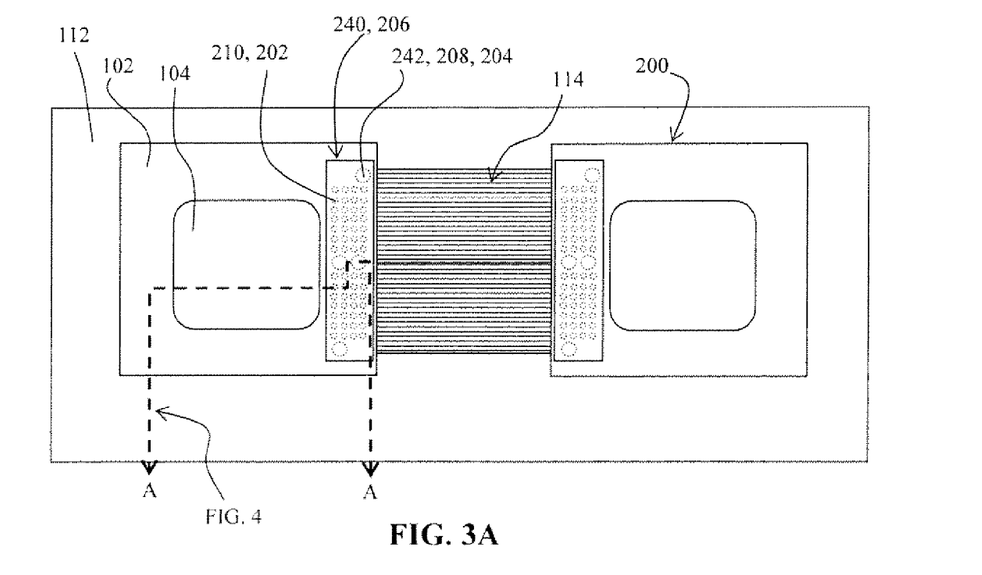
FIG. 3A-FIG. 3D illustrate top views of various embodiments of the invention.

Different configurations of substrate guiding through holes 204 and I/O contact pads 202 formed on substrate package 200 may be contemplated. FIG. 3A illustrates a top view of an embodiment of two substrate packages 200 interconnected with flex cables 114. Substrate packages 200 may be commonly attached to motherboard 112. In an embodiment, one or both substrate packages 200 may be attached directly to motherboard 112. In another embodiment, one or both substrate packages 200 may be placed in a component socket attached to motherboard 112. In an embodiment, substrate guiding holes 204 and I/O contact pads 202 may be formed anywhere on substrate packages 200 outside the perimeter of die 104. In an embodiment, flex connector 206, flex cables 114 and guiding plate 240 are assembled on substrate package 200 such that connector guiding through holes 208, cable guiding through holes 245 are aligned against substrate guiding through holes 204 to form continuous through holes penetrated by guiding pins 242. In an embodiment, substrate package 200 may include two pluralities of I/O contact pads 202 and four substrate guiding through holes 204. Substrate packages 200 may be interconnected with two flex cables 114 with each end having two cable guiding holes 245.

Figure 3B:
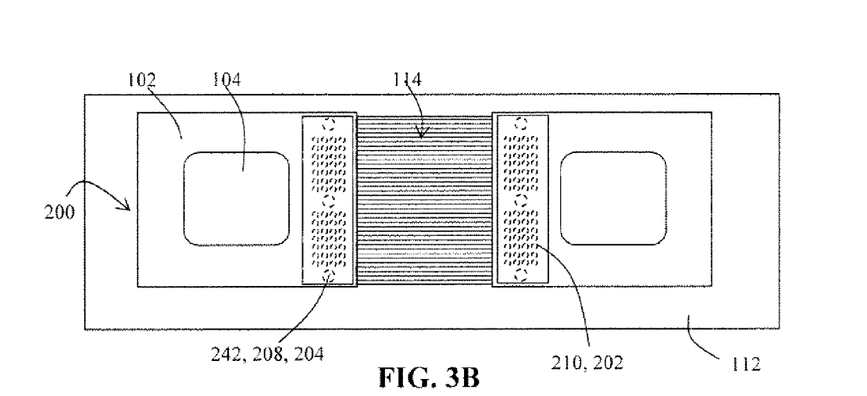
Figure 3C:
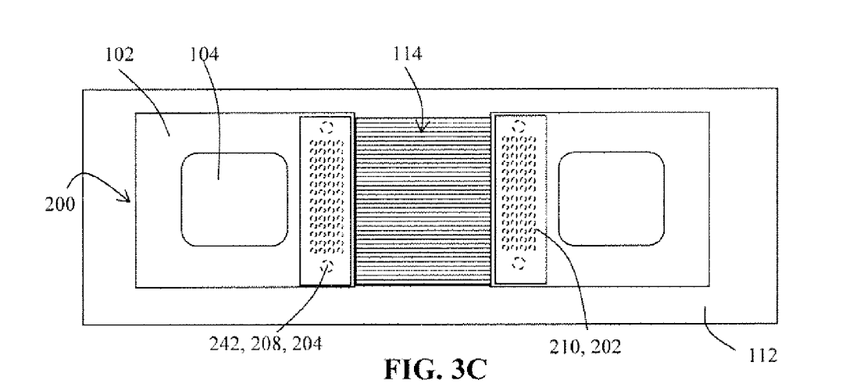
Figure 3D:
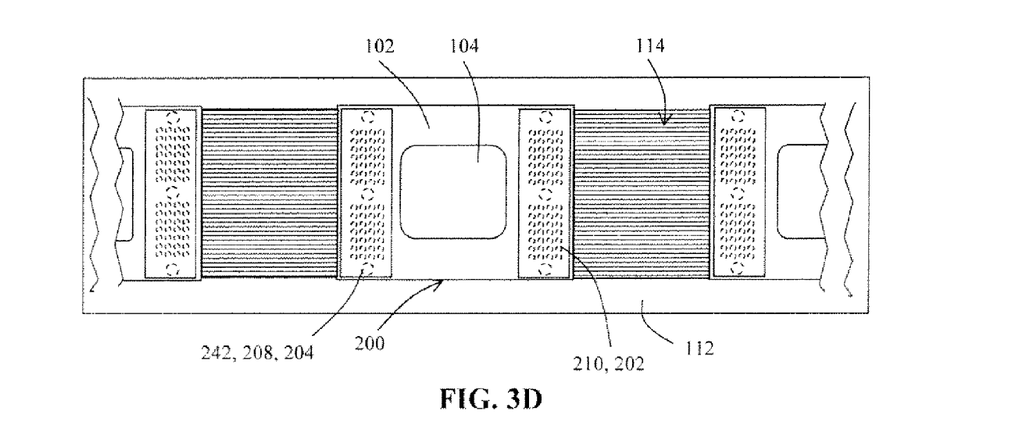

Other embodiments may be contemplated. FIG. 3B illustrates a top view of an embodiment of substrate packages 200 having three substrate guiding through holes 904 and two pluralities of I/O contact pads 202 on each substrate package 200. Substrate packages 200 may be connected with a single flex cable 114. FIG. 3C illustrates a top view of another embodiment of substrate packages 200 having two substrate guiding holes 204 and a plurality of I/O contact pads 202, and interconnected with a single flex cable 114. Other embodiments may include interconnecting more than two substrate packages 200. FIG. 3D illustrates an embodiment having three substrate packages 200 interconnected with flex cables 114.

Figure 4:
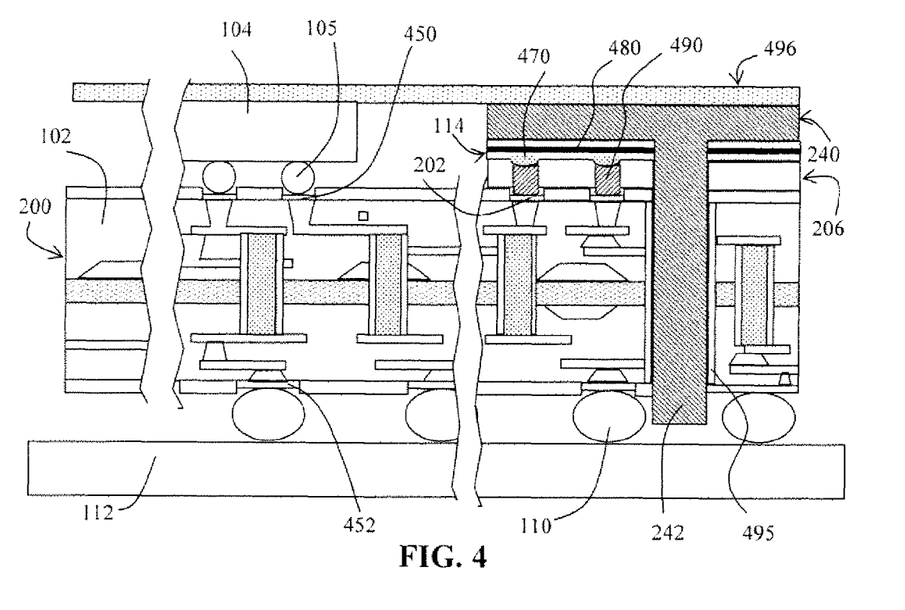
FIG. 4 illustrates a cross sectional view of an embodiment of the invention.

Next, details of the assembly of the various component parts according to an embodiment will be explained. FIG. 4 illustrates a cross sectional view of an embodiment of the invention obtained from cross section A-A depicted in FIG. 3A. Substrate package 200 is connected to motherboard 112 via a plurality of solder balls 110 soldered to solder pads 452. Semiconductor die 104 may be attached to a plurality of die bump pads 450 formed on the top surface of substrate body 102 via die bumps 105. In another embodiment, other types of die-substrate interconnection such as wire-bonding may be possible. In an embodiment, a plurality of high speed I/O contact pads 202 may be formed on substrate body 102. In an embodiment, I/O contact pads 202 are electrically connected to die bump pads 450 such that signals from die 104 may be directly transmitted to I/O contact pads 202 as well as signals from other substrate packages 200 may be received via I/O contact pads 202 and be transmitted to die 104. In another embodiment, two or more pluralities of I/O contact pads 202 may be formed on substrate body 102. In an embodiment, the diameter of I/O contact pads 202 may range from 0.2-0.5 mm. In an embodiment, the pitch of I/O contact pads 202 is between 0.4 and 1 mm.

According to an embodiment, substrate package 200 may include a plurality of substrate guiding through holes 204. Substrate guiding through holes 204 are provided as a mechanical alignment feature to guide assembly of flex connector 206, flex cables 114, and guiding plate 240 on substrate package 200. More specifically and referring to FIG. 2A and FIG. 4, connector guiding through holes 208 and cable guiding through holes 245 are aligned against substrate guiding through holes 204 to form continuous through holes penetrated by guiding pins 242. In an embodiment, substrate guiding through holes 204 may be formed adjacent to and between pluralities of I/O contact pads 202.

In an embodiment, substrate guiding through holes 204 are hermetically-sealed through holes formed on substrate body 102. Substrate guiding holes 204 are impervious to moisture to prevent moisture from seeping into substrate body 102. In an embodiment, the hermetic sealing of substrate guiding through holes 204 is provided by a layer of metal 495 on the hole wall of substrate guiding through holes 204 as illustrated in FIG. 4. In an embodiment, copper may be used to metallize the hole wall of substrate guiding holes 204 by way of electrolytic plating process. In an embodiment, a uniform layer of copper of thickness between 15-25 μm may be plated on the hole wall of substrate guiding through holes 204. In an embodiment, substrate guiding through holes 204 are electrically grounded. In an embodiment, substrate guiding through holes 204 are electrically isolated from I/O contact pads 202, die bump pads 450 and the internal circuitry of substrate package 200. In an embodiment, the diameter of substrate guiding through holes 204 is independent of the size of substrate package 200. In an embodiment, the diameter of substrate guiding holes 204 is 0.75-1.5 mm.

According to an embodiment, flex connector 206 may be provided as a separable interface to bridge connection between substrate package 200 and flex cables 114. In another embodiment, flex connector 206 may not be required and flex cables 114 may be disposed directly on substrate package 200 while still being separable. In an embodiment as illustrated in FIG. 2, flex connector 206 may include electrically conductive connector contacts 490 and connector guiding holes 208 corresponding to the layout of I/O contact pads 202 and substrate guiding holes 204. In an embodiment, each connector contact 490 may include a top portion and a bottom portion. When connector guiding holes 208 are properly aligned with substrate guiding through holes 204, the bottom portion of connector contacts 490 will make contact with I/O contact pads 202. In an embodiment, flex connector may be made from polyimide or liquid crystal polymer dielectric materials. In an embodiment, connector guiding holes 208 may be 0-10% larger than substrate guiding through holes 204.

Referring back to FIG. 2, according to an embodiment, one or more flex cables 114 may be detachably disposed on flex connector 206. Flex cable 114 provides detachable electrical connection between substrate packages 200. In an embodiment, each end of flex cable 114 may include a plurality of cable contacts 470 formed on the bottom side of flex cable 114 and a plurality of cable guiding through holes 245. As illustrated in FIG. 4, when cable guiding through holes 245 are properly aligned with connector guiding through holes 208 and substrate guiding through holes 204, cable contacts 470 will make contact with the top portion of connector contacts 490 and thus form connection between flex cable 114 and substrate package 200. Cable contacts 470 on each end of flex cable 114 are electrically connected by way of a plurality of cable circuit lines 480. In an embodiment, the spacing between circuit lines 480 may range between 37-75 μm. In an embodiment, commercially available polyimide-based or liquid crystal polymer-based flex cables may be used.

Referring to FIG. 2 and FIG. 4, according to an embodiment of the invention, guiding plate 240 may be detachably disposed on an aligned assembly of flex cables 114, flex connector 206 and substrate package 200. In an embodiment, guiding plate may include a plurality of guiding pins 240. Guiding pins 242 are provided to maintain alignment of flex cables 114, flex connector 206 and substrate package 200, all of which are aligned and disposed below guiding plate 240. Specifically, guiding pins 242 may penetrate cable guiding through holes 245, connector guiding through holes 208 and substrate guiding through holes 204 to prevent lateral displacement of guiding plate 240, flex cable 114 and flex connector 206 relative to substrate package 200. In an embodiment, guiding pins 242 may penetrate the entire depth of substrate body 102 and protrude from the bottom surface of substrate body. In another embodiment, guiding pins 242 may be suspended within substrate guiding through holes 204. In an embodiment, the bottom end of guiding pins 242 does not require mechanical support. In an embodiment, guiding pins 242 may be formed on the bottom side of guiding plate 240 and correspond to the layout of substrate guiding through holes 204. In an embodiment, the length of guiding pins 242 may be 2-5 mm. In an embodiment, the diameter of guiding pins 242 may be ±10% of the diameter of substrate guiding through holes 204. In another embodiment, the diameter of guiding pins 242 may be 1-3 mm.

Still referring to FIG. 4, flex cables 114 and flex connector 206 are pressed against substrate package 200 by way of the mechanical load of guiding plate 240. Flex cables 114 may be compressively clipped by guiding plate 240 on the top and flex connector 206 at the bottom. In an embodiment, heat sink 496 may be disposed on die 104 to dissipate heat generated by die 104. Heat sink 496 may be designed to be large enough such that a portion of heat sink is disposed on guiding plate 240 as illustrated in FIG. 4. In an embodiment, the cumulative height of the separable assembly of flex connector 206, flex cables 114 and guiding plate 240 from substrate body 102 may be designed to be coplanar with the height of the top surface of die 104 from substrate body 102. The compressive load of heat sink 496 against guiding plate 240 assists in maintaining the alignment of the assembly of guiding plate 240, flex cables 114, flex connector 206 and substrate package 200. In another embodiment, the height of guiding plate 240 from the top surface of substrate body 102 may be 75-125% of the height of the top surface of die 104 from substrate body 102.

Figure 5A:
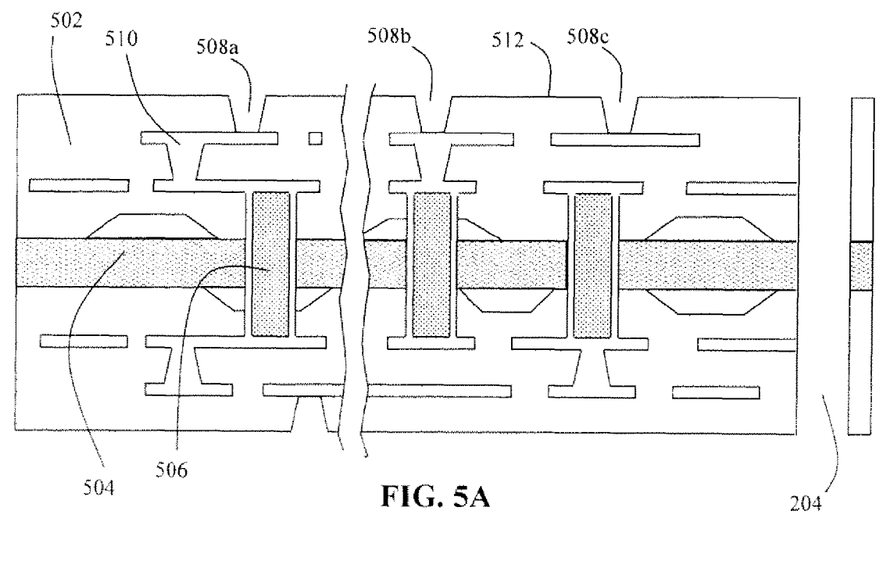
FIG. 5A-FIG. 5E illustrate cross sectional views of a substrate package at different stages of fabrication according to an embodiment of the invention.

Next, a method of fabrication of substrate package 200 according to an embodiment is explained. FIG. 5A illustrates a cross sectional view of an embodiment of substrate 502 fabricated up to the top build-up layer with via holes 508a, 508b, 508c and substrate guiding through hole 204 formed. In an embodiment, substrate 502 may be fabricated from copper-clad dielectric materials while substrate core 504 is constructed from bismaleimide triazine resin (BT). Gap-filling material 506 may be made from epoxy material. In an embodiment, a plurality of via holes 508a, 508b, 508c may be formed on the surface of the top build-up layer by way of laser drilling. Copper traces 510 form the conductive paths connecting different layers of substrate 502. Specifically, copper traces 510 provide electrical connection between via holes 508a and via holes 508b, 508c. In an embodiment, substrate guiding through hole 204 may be formed by mechanically drilling the entire thickness of substrate 502 to obtain a through hole. In an embodiment, substrate guiding through hole 204 may have diameter ranging from 0.75 to 1.5 mm. In an embodiment, hole wall of via holes 508a, 508b, 508c and substrate guiding hole 204 is desmeared to remove drilling debris deposited on hole wall after the drilling process.

Figure 5B:
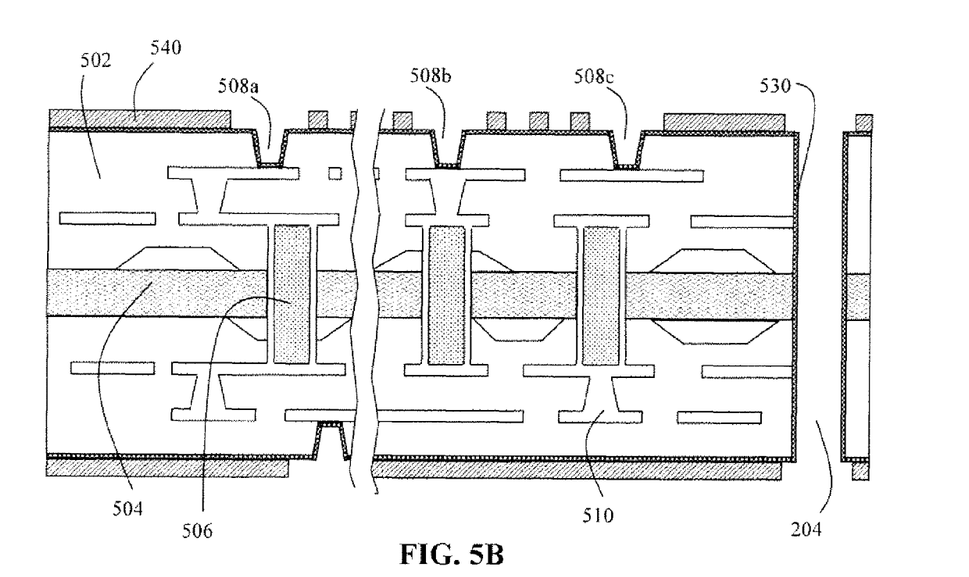

The next step involves electroplating and masking of the surface of substrate 502. FIG. 5B illustrates a cross sectional view of an embodiment of substrate 502 after being electroplated and masked to create patterned features. After desmearing, the surface of substrate 502 and hole wall of via holes 508a, 508b, 508c and substrate guiding hole 204 is electroplated with metal seed layer 530. In an embodiment, metal seed layer 530 may be copper. In an embodiment metal seed layer may be 0.7 μm thick. In an embodiment, metal seed layer 530 may be formed by way of electroless plating. In an embodiment, the surface of substrate 502 and hole wall of via holes 508a, 508b, 508c and substrate guiding through hole 204 may be simultaneously plated with metal seed layer 530. Next, the surface of substrate 502 is prepared to create patterned features. In an embodiment, patterned plating technique may be used. First, portions of seed layer 530 are masked off to define regions for subsequent patterned plating process. In an embodiment, dry film 540 may be formed on portions of metal seed layer 530 to expose certain regions of metal seed layer 530. Regions of metal seed layer 530 not covered by dry film 540 will subsequently be electroplated to create patterned features. In an embodiment, regions around the opening of via holes 508a, 508b, 508c and substrate guiding through hole 204 are not masked by dry film 540 to define regions intended to be filled with electroplating material and to build patterned features.

Figure 5C:
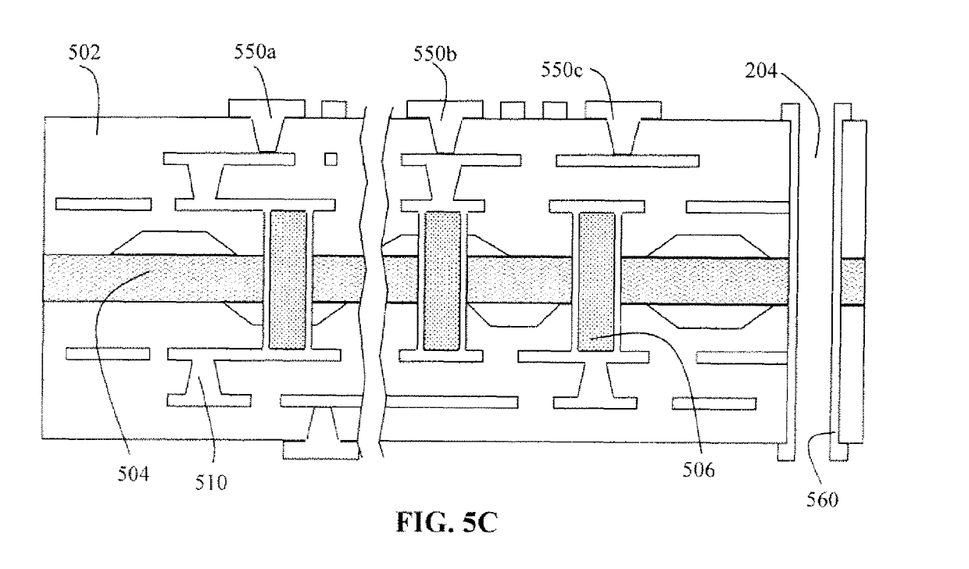

The next step involves plating regions not covered by dry film 540 to create patterned features and further plating substrate guiding through hole 204. FIG. 5C illustrates a cross sectional view of an embodiment of substrate 502 having patterned features 550a, 550b, 550c built and substrate guiding hole 204 plated. In an embodiment, via holes 508a, 508b, 508c and substrate guiding hole 204 may be simultaneously plated by way of electrolytic plating. In an embodiment, via holes 508a, 508b, 508c and substrate guiding hole 204 are electroplated with copper 560. In an embodiment, the opening of via holes 508a, 508b, 508c not masked by dry film 540 is filled with copper 560 leaving recess of less than 5 μm and copper 560 of thickness between 15 and 25 μm. In an embodiment, Periodic Reverser Pulse Plating (PRPP) technology may be used to simultaneously plate via holes 408a, 408b, 408c and substrate guiding through hole 204. Complex pulse waveforms may be applied by sequentially combining a number of different waveforms. Each waveform may contribute to a specific geometry of the patterned features to be formed. In an embodiment, a first waveform may be catered for filling via holes 508a, 508b, 508c while a second waveform may be catered for plating substrate guiding through hole 204. After forming patterned features 550a, 550b, 550c and electroplating substrate guiding through hole 204 with copper 560, dry film 540 and metal seed layer 530 may be removed by way of quick etching. Substrate guiding through hole 204 is now hermetically-sealed. Copper layer 560 acts as an impervious moisture barrier to prevent moisture from seeping into substrate 502 through substrate guiding hole 204.

Figure 5D:
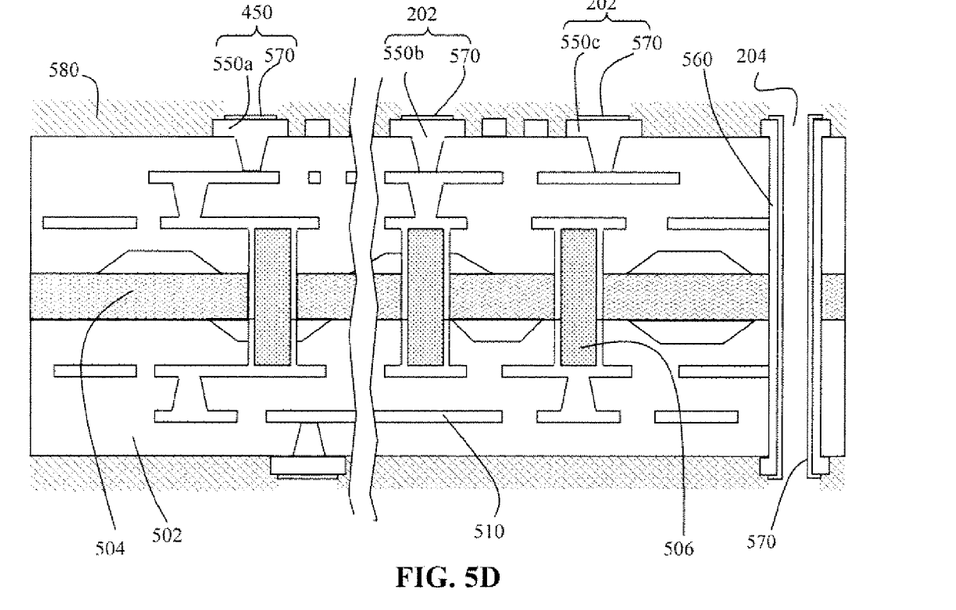

FIG. 5D illustrates an embodiment of substrate 502 having coated with surface finish and solder resist. After seed layer 530 and dry film 540 are removed, the top and bottom surfaces of substrate 502 may be coated with photoimagable solder resist 580. Solder resist 580 is then selectively exposed through a stencil to form solder resist openings corresponding to patterned features 550a, 550b, 550c and substrate guiding through hole 204. Next, in an embodiment, patterned features 550a, 550b, 550c and hole wall of substrate guiding hole 204 are simultaneously plated with surface finish 570. In an embodiment, surface finish 570 may be Electroless Nickel/Immersion Gold (ENIG), ENIG+Electroless Gold (ENIG+EG) and Nickel-Palladium-Gold (NiPdAu). Patterned feature 550a forms die bump pad 450 while patterned features 550b, 550c form high speed I/O contact pads 202.

Figure 5E:
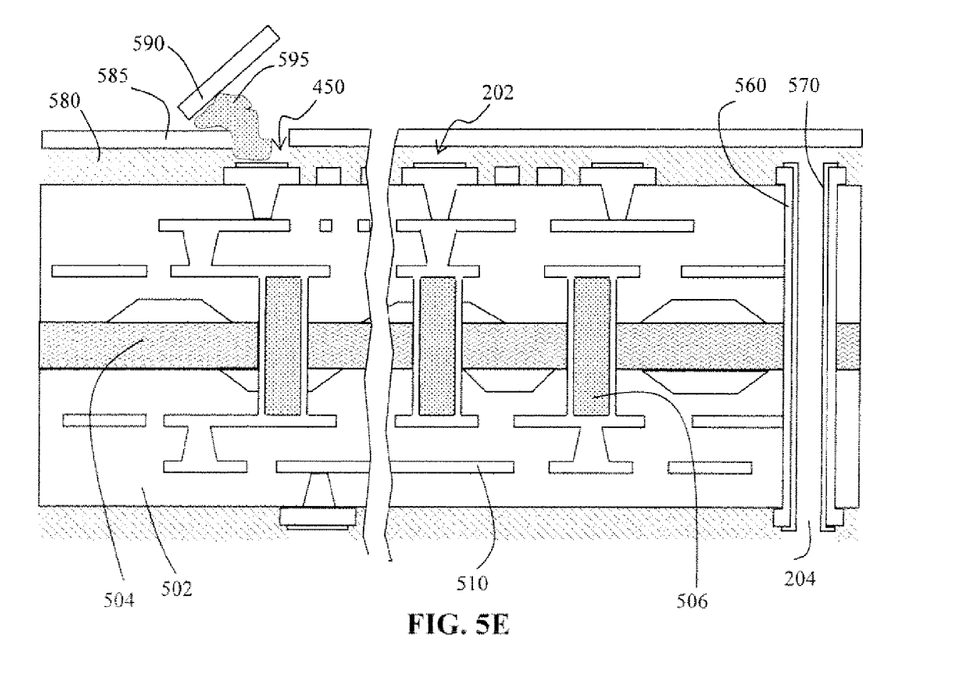

FIG. 5E illustrates an embodiment of solder paste 595 being printed on die bump pad 450 to prepare for die attach.

In an embodiment, stencil-printing method may be employed to deposit solder paste 595 on die bump pad 450. Stencil 585 is placed over substrate 502 with openings exposing die bump pad 450 and while masking off I/O contact pads 202. Squeegee 590 sweeps solder paste 595 along stencil 585 and deposits solder paste 595 on die bump pad 450. Die 104 and die bumps 105 is then reflowed to form connection between die 104 and substrate 502 as illustrated in FIG. 4.

What is claimed is:

1. A semiconductor device, comprising:
    a plurality of die bump pads formed on a substrate package;
    a die attached to the plurality of die bump pads;
    a plurality of input/output (I/O) contact pads formed on the package, wherein the I/O contact pads are electrically connected with the die bump pads;
    a plurality of hermetically-sealed substrate guiding through holes formed adjacent to the I/O contact pads;
    a plurality of cable contacts formed proximate to both ends of a flex cable, wherein the cable contacts proximate to one end of the flex cable are electrically connected with the I/O contact pads; and
    a guiding plate detachably disposed on the flex cable, wherein the guiding plate includes a plurality of guiding pins penetrating the substrate guiding through holes.

2. The device of claim 1, further comprising a heat sink disposed on the die and the guiding plate.

3. The device of claim 2, further comprising a flex connector disposed between the package and the one or more flex cables, wherein the flex connector includes a plurality of connector contacts and a plurality of connector guiding through holes.

4. The device of claim 3, wherein the plurality of connector contacts is electrically connected with the plurality of I/O contact pads and the plurality of cable contacts.

5. The device of claim 4 wherein the flex cable includes at least one cable guiding through hole formed proximate to each end of the flex cable.

6. The device of claim 5, wherein the plurality of guiding pins penetrates the plurality of connector guiding through holes and the plurality of cable guiding through holes.

7. The device of claim 1, wherein the plurality of substrate guiding through holes is electrically isolated.

8. The device of claim 7, wherein the plurality of substrate guiding through holes is plated by copper.

9. The device of claim 8, wherein the thickness of copper is 15-25 μm.

10. An electronic assembly, comprising:
    a first substrate package and a second substrate package, wherein each package includes a die attached to a plurality of die bump pads;
    a plurality of input/output (I/O) contact pads formed on the substrate packages, wherein the I/O contact pads are electrically connected with the die bump pads;
    a plurality of hermetically-sealed substrate guiding through holes formed adjacent to the I/O contact pads;
    a plurality of cable contacts formed proximate to both ends of a flex cable, wherein the cable contacts are electrically connected with the I/O contact pads; and
    a guiding plate disposed proximate to each end of the flex cable, wherein the guiding plate includes a plurality of guiding pins penetrating the substrate guiding through holes.

11. The assembly of claim 10, wherein the flex cable includes at least one cable guiding through hole formed proximate to each end of the flex cable.

12. The assembly of claim 11, further comprising a flex connector disposed between each of the package and the flex cable, wherein the flex connector includes a plurality of connector contacts and a plurality of connector guiding through holes.

13. The assembly of claim 12, wherein the connector contacts are electrically connected with the I/O contact pads and cable contacts.

14. The assembly of claim 13, wherein the guiding pins penetrate the connector guiding through holes and cable guiding through holes.

15. The assembly of claim 14, wherein the substrate guiding through holes are electrically isolated and plated with copper of thickness between 15-25 μm.

\* \* \* \* \*